(12) United States Patent
Cramer

(10) Patent No.: US 10,476,543 B2
(45) Date of Patent: Nov. 12, 2019

(54) METHOD AND APPARATUS FOR CHIP-ON BOARD FLEXIBLE LIGHT EMITTING DIODE

(71) Applicant: Alliance Sports Group, L.P., Fort Worth, TX (US)

(72) Inventor: Steven Cramer, Redmond, WA (US)

(73) Assignee: Alliance Sports Group, L.P., Grand Prairie, TX (US)

( * ) Notice: Subject to any disclaimer, the term of this patent is extended or adjusted under 35 U.S.C. 154(b) by 0 days.

(21) Appl. No.: 16/152,846

(22) Filed: Oct. 5, 2018

(65) Prior Publication Data
US 2019/0319660 A1    Oct. 17, 2019

Related U.S. Application Data

(63) Continuation of application No. 15/138,027, filed on Apr. 25, 2016, now Pat. No. 10,097,228.
(Continued)

(51) Int. Cl.
*H04B 1/3888* (2015.01)
*H01L 33/54* (2010.01)
(Continued)

(52) U.S. Cl.
CPC ............. *H04B 1/3888* (2013.01); *F21L 4/00* (2013.01); *F21V 29/507* (2015.01); *F21V 29/70* (2015.01);
(Continued)

(58) Field of Classification Search
CPC ....... H01L 33/54; H01L 33/642; F21V 29/70; F21V 29/507; H04B 1/3888
(Continued)

(56) References Cited

U.S. PATENT DOCUMENTS

| 6,357,893 B1 | 3/2002 | Belliveau |
| 7,207,693 B2 | 4/2007 | Ratcliffe |

(Continued)

FOREIGN PATENT DOCUMENTS

| CN | 103649634 A | 3/2014 |
| CN | 104048195 A | 9/2014 |

(Continued)

OTHER PUBLICATIONS

Rak Hwan Kim, Printed Microscale Inorganic Light Emitting Diodes on Flexible Substrates for Display, Biomedical, and Robotic Application, Dissertation submitted in partial fulfillment of the requirements for the degree of Doctor of Philosophy in Materials Science and Engineering in the Graduate College of the University of Illinois at Urbana-Champaign, Sep. 18, 2012, 164 pages.

*Primary Examiner* — Igwe U Anya
(74) *Attorney, Agent, or Firm* — Thorpe North & Western LLP

(57) ABSTRACT

A lighting device is disclosed having a plurality of LED chips mounted on a single planar flexible substrate, wherein the single planar flexible substrate is disposed in an arcuate orientation. A heat sink having an arcuate surface shaped to approximate the arcuate orientation of the flexible substrate is coupled to the flexible substrate between complementary arcuate surfaces. A luminescent coating is disposed about a top surface of the arcuate single planar flexible substrate.

20 Claims, 14 Drawing Sheets

Related U.S. Application Data

(60) Provisional application No. 62/151,559, filed on Apr. 23, 2015.

(51) Int. Cl.

| | | |
|---|---|---|
| *H01L 33/64* | (2010.01) | |
| *F21L 4/00* | (2006.01) | |
| *F21V 29/507* | (2015.01) | |
| *G03B 17/56* | (2006.01) | |
| *H01L 27/15* | (2006.01) | |
| *F21V 33/00* | (2006.01) | |
| *H04M 1/18* | (2006.01) | |
| *H04M 1/22* | (2006.01) | |
| *F21V 29/70* | (2015.01) | |
| *F21V 29/89* | (2015.01) | |
| *F21Y 115/10* | (2016.01) | |
| *F21Y 103/00* | (2016.01) | |
| *F21Y 101/00* | (2016.01) | |

(52) U.S. Cl.
CPC ........ *F21V 33/0052* (2013.01); *G03B 17/566* (2013.01); *H01L 27/153* (2013.01); *H01L 33/54* (2013.01); *H01L 33/642* (2013.01); *H04M 1/185* (2013.01); *H04M 1/22* (2013.01); *F21V 29/89* (2015.01); *F21Y 2101/00* (2013.01); *F21Y 2103/00* (2013.01); *F21Y 2115/10* (2016.08); *G03B 2215/0517* (2013.01); *G03B 2215/0567* (2013.01); *H01L 2933/0033* (2013.01); *H01L 2933/0041* (2013.01); *H01L 2933/0075* (2013.01)

(58) Field of Classification Search
USPC .......................................... 257/88
See application file for complete search history.

(56) References Cited

U.S. PATENT DOCUMENTS

| | | |
|---|---|---|
| 7,557,367 B2 | 7/2009 | Rogers et al. |
| 8,722,458 B2 | 5/2014 | Rogers et al. |
| 8,922,511 B1 | 12/2014 | Salmon |
| 2004/0150714 A1* | 8/2004 | Lin .................. G01N 21/8806 348/126 |
| 2007/0295973 A1 | 12/2007 | Jinbo |
| 2008/0253145 A1 | 10/2008 | Biarne et al. |
| 2010/0171138 A1 | 7/2010 | Yamazaki et al. |
| 2012/0175667 A1 | 7/2012 | Golle |
| 2012/0295376 A1 | 11/2012 | Lee et al. |
| 2013/0010460 A1 | 1/2013 | Peil |
| 2013/0077298 A1 | 3/2013 | Steele et al. |
| 2013/0221846 A1* | 8/2013 | Alexiou .................. F21V 29/75 315/51 |
| 2013/0223071 A1* | 8/2013 | Nishimori ............... F21S 2/005 362/244 |
| 2013/0286645 A1 | 10/2013 | Bukkems |
| 2014/0036205 A1 | 2/2014 | Sugiura |
| 2014/0078582 A1 | 3/2014 | Cho |
| 2014/0092630 A1 | 4/2014 | Franklin et al. |
| 2014/0098529 A1 | 4/2014 | Hata |
| 2014/0111953 A1 | 4/2014 | McClure et al. |
| 2014/0140082 A1 | 5/2014 | Kuboyama et al. |
| 2014/0226330 A1 | 8/2014 | Yun |
| 2014/0239276 A1 | 8/2014 | Lin et al. |
| 2014/0240985 A1 | 8/2014 | Kim et al. |
| 2014/0254152 A1 | 9/2014 | Bohler |
| 2014/0264299 A1 | 9/2014 | Naijo |
| 2014/0264407 A1 | 9/2014 | Tischler |
| 2014/0268739 A1 | 9/2014 | Veres et al. |
| 2014/0369038 A1 | 12/2014 | Tischler et al. |
| 2015/0109778 A1 | 4/2015 | Yokotani |
| 2015/0276198 A1 | 10/2015 | Hata |
| 2016/0147055 A1 | 5/2016 | Moriuchi |

FOREIGN PATENT DOCUMENTS

| | | |
|---|---|---|
| DE | 20 2010 005 863 | 8/2010 |
| JP | 2001283612 A | 10/2001 |
| WO | WO 2010/132552 | 11/2010 |
| WO | WO 2011/126726 | 10/2011 |
| WO | WO 2014/035014 | 3/2014 |

* cited by examiner

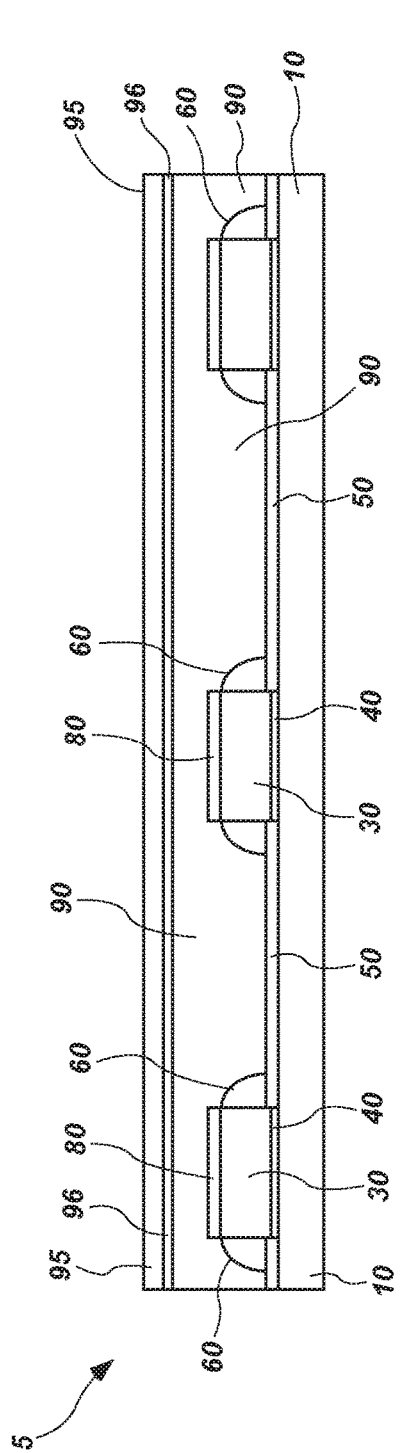
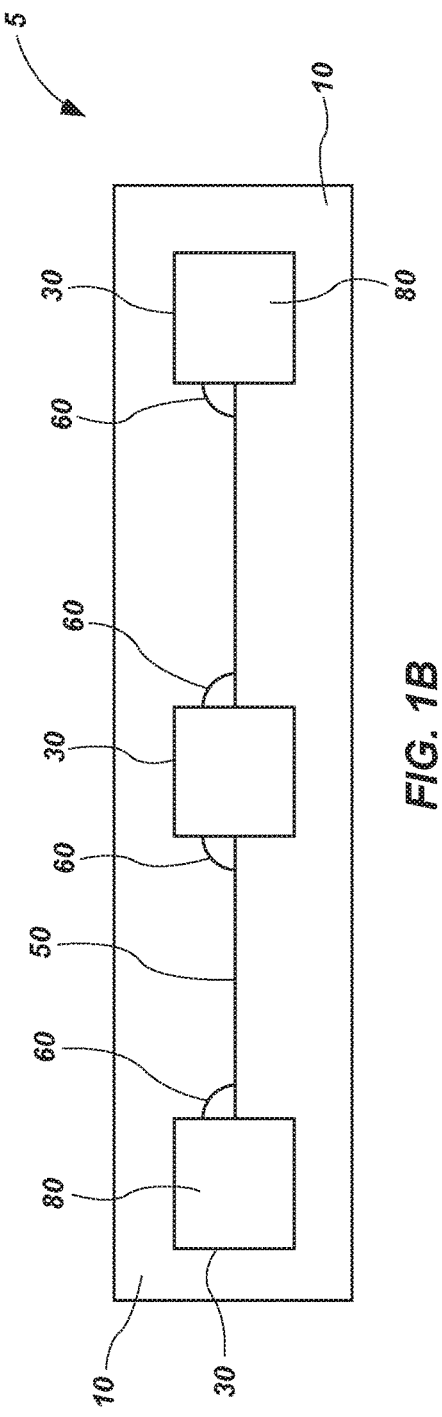

METHOD AND APPARATUS FOR CHIP-ON BOARD FLEXIBLE LIGHT EMITTING DIODE

PRIORITY CLAIM

This application claims priority to U.S. Provisional Patent Application No. 62/151,559 filed on Apr. 23, 2015 and U.S. Non-Provisional patent application Ser. No. 15/138,027 filed on Apr. 25, 2016, both entitled "Method and Apparatus for Chip-On Board Flexible Light Emitting Diode" which are both incorporated herein by reference in their entirety.

FIELD OF THE TECHNOLOGY

The present technology relates generally to the field of light emitting diode technology and more particularly to flexible chip-on board LED technology.

BACKGROUND

The present technology relates generally to Light Emitting Diode (LED) lighting components, lamps, and luminaries which can be used as light sources in various lighting applications. Some of the significant advantages to LED's over conventional lighting elements are their significantly lower power consumption, the absence of harmful chemicals, their durability in resisting shock and vibration and their lifetime. Industrial commercial and consumer applications utilize LEDs of different power levels in various applications having different levels of technical challenges and limitations. Higher power LEDs, applied either singly or in clusters, (i.e., those greater than about 10 W) are used mainly in applications where high level of lumen output is required from constrained size. Typical applications are filament bulb replacements for power levels of 40 W and up, spot lights, track lights etc. Medium power LEDs are used on applications for example where different light guides are used for producing even light output on large surfaces.

High lumen LED assemblies are assembled on a metal core printed circuit board (MCPCB), or on aluminum substrate, which is connected to a ceramic, plastic or aluminum heat sink. Ceramic heat sinks make it possible to use different thick film methods to manufacture the interconnections directly on top of the heat sink. Plastic heat sinks are used mainly with MCPCBs for relatively low power solutions. After the heat has been conducted through the thermal interfaces between the heat dissipating body and the PCB or MCPCB into its aluminum plate, further heat conduction is done from the bottom of the PCB, enhanced by different thermal interface materials and different fastening methods, e.g. screws.

In many LED lighting applications, several high power LEDs need to be placed in close configuration, such as flashlights, headlights and the like. The heat generating components, their power supplies, the PCBs, the thermal interface materials, the fixing structures and heat dissipating bodies, all together dictate the achievable performance level in the lighting application. The resulting structure of the high power LED is rigid and therefore limits it use and application. It is therefore desirable to have a flexible high power LED.

BRIEF DESCRIPTION OF THE DRAWINGS

Features and advantages of the technology will be apparent from the detailed description which follows, taken in conjunction with the accompanying drawings, which together illustrate, by way of example, features of the technology; and, wherein:

FIG. 1a is a side view illustrating one aspect of a flexible COB LED array in accordance with one aspect of the technology;

FIG. 1b is a top view of FIG. 1a;

DETAILED DESCRIPTION

Figure 2:
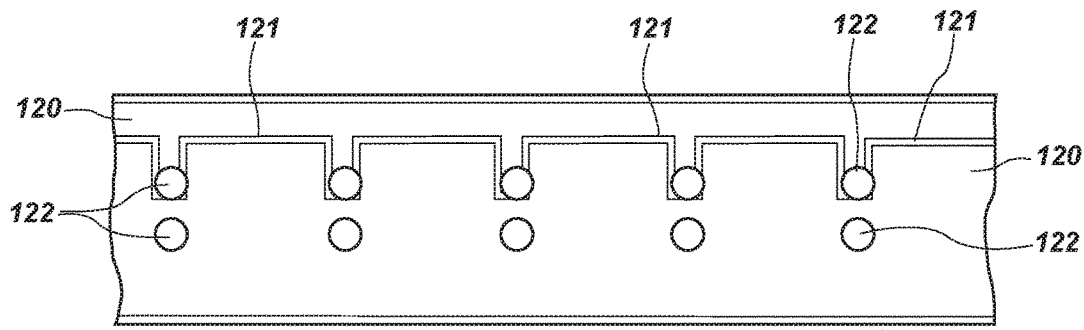
FIG. 2 is a side view of a flexible substrate in accordance with one aspect of the technology.

Although the following detailed description contains many specifics for the purpose of illustration, a person of ordinary skill in the art will appreciate that many variations and alterations to the following details can be made and are considered to be to included herein. Accordingly, the following embodiments are set forth without any loss of generality to, and without imposing limitations upon, any claims set forth. It is also to be understood that the terminology used herein is for the purpose of describing particular embodiments only, and is not intended to be limiting. Unless defined otherwise, all technical and scientific terms used herein have the same meaning as commonly understood by one of ordinary skill in the art to which this disclosure belongs.

As used in this specification and the appended claims, the singular forms "a," "an" and "the" include plural referents unless the context clearly dictates otherwise. Thus, for example, reference to "a layer" includes a plurality of such layers.

In this disclosure, "comprises," "comprising," "containing" and "having" and the like can have the meaning ascribed to them in U.S. patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. patent law. "Consisting essentially of" or "consists essentially of" have the meaning generally ascribed to them by U.S. patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the compositions nature or characteristics would be permissible if present under the "consisting essentially of" language, even though not expressly recited in a list of items following such terminology. When using an open ended term, like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that any terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein. The term "coupled," as used herein, is defined as directly or indirectly connected in an electrical or nonelectrical manner. Objects described herein as being "adjacent to" each other may be in physical contact with each other, in close proximity to each other, or in the same general region or area as each other, as appropriate for the context in which the phrase is used. Occurrences of the phrase "in one embodiment," or "in one aspect," herein do not necessarily all refer to the same embodiment or aspect.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. Unless otherwise stated, use of the term "about" in accordance with a specific number or numerical range should also be understood to provide support for such numerical terms or range without the term "about". For example, for the sake of convenience and brevity, a numerical range of "about 50 angstroms to about 80 angstroms" should also be understood to provide support for the range of "50 angstroms to 80 angstroms."

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

Reference in this specification may be made to devices, structures, systems, or methods that provide "improved" performance. It is to be understood that unless otherwise stated, such "improvement" is a measure of a benefit obtained based on a comparison to devices, structures, systems or methods in the prior art. Furthermore, it is to be understood that the degree of improved performance may vary between disclosed embodiments and that no equality or consistency in the amount, degree, or realization of improved performance is to be assumed as universally applicable.

An initial overview of the technology is provided below and specific technology embodiments are then described in further detail. This initial summary is intended to aid readers in understanding the technology more quickly, but is not intended to identify key or essential features of the technology, nor is it intended to limit the scope of the claimed subject matter.

Broadly speaking, aspects of the current technology improve and make possible the manufacture of chip onboard (COB) LEDs on a flexible substrate. In one aspect of the technology, the flexible COB LED is manufactured using a first fixture to hold a flexible substrate in place and provide general location reference targets for aligning chip placement, wire bonding, and gel dipping. The flexible substrate comprises conductive trace pads thereon. An adhesive is placed on the flexible substrate followed by placement of LED chips (or dies) onto the flexible substrate. This assembly is then heated for curing. The leads of the LED dies are then wire bonded to the conductive trace pads on the flexible substrate. A second fixture is used to hold the flexible substrate and bonded die sub-assembly in place while a first coating of silicone or other protective material is deposited on the LED dies. This subassembly is then heated for curing. A third fixture may be used and is placed over the sub-assembly that holds the sub-assembly immobile and provides a flow dam as silicone gel is flooded over the LED array, followed again by a third heating step. The gel flooding may also be performed in some cases without the need for the third fixture. The resulting flexible COB LED array can then be used in any number of applications (e.g., spotlights, hand-held flashlights, headlamps, bicycle lighting, etc.) where an array having a planar geometry is applied to an arcuate surface to provide a light source.

In another method for fabrication, the dies are fixed to the flexible substrate, cured, wire bonded, cured again, selective coating of silicone covering the dies and wire bonds and curing in the same fashion as described above. This assembly is then mounted with thermally conductive adhesive to a pre-shaped aluminum (or other heat conductive) structure of desired arcuate shape and inserted into a transparent or translucent plastic housing. A final luminescent (e.g., a silicone-phosphor or other) coating is injected into the intended space between the outer wall of the transparent/translucent housing and the light emitting surface of the flexible COB LED assembly, filling the space. In an optional aspect, the housing is pre-loaded with a quantity of silicone-phosphor coating before the flexible COB LED assembly is placed within the housing. Any remaining space is then filed with additional silicone-phosphor material. In one aspect, the assembly is then placed into a vacuum chamber to remove unwanted bubbles that may be present in the coating material. The entire assembly is again cured. The resulting non-planar COB LED assembly is used as a drop-in module into a final lighting product having a power source (i.e., battery, plug-in power supply, etc.) coupled thereto.

With reference now to FIGS. 1a and 1b, in accordance with one aspect of the technology, a COB LED structure 5 is disclosed. The COB LED structure 5 includes a flexible substrate 10, an LED chip 30, a thermally conductive binding layer 40, a circuit layer 50, a plurality of electrical connection lines 60, a binder (e.g., clear epoxy or fluorescent adhesive) 80, and a package coating 90. It is understood, however, that not all of the above-referenced components are required in a COB LED structure used with the present technology. In addition, other components may be used as suits a particular application.

In accordance with one aspect of the technology, the flexible substrate 10 comprises a flexible printed circuit board (PCB) made of a flexible polymer, including polyamide, PTFE, acrylics, etc. Broadly speaking, a flexible PCB is an array of conductors (or conductive material) bonded to or formed with a thin dielectric film. In one aspect of the technology, a single-sided flexible substrate 10 is employed and comprises a single conductive layer made of either a metal or conductive polymer on a flexible dielectric film with component termination (or connection) features accessible only from one side. Holes may be formed in the base film to allow component leads to pass through for interconnection by soldering, for example. In another aspect, double access flex, also known as back bared flex are employed. These circuits are flexible circuits having a single conductor layer that is processed so as to allow access to selected features of the conductor pattern from both sides. In another aspect of the technology, a double sided flexible PCB is employed. Double-sided flex circuits are flex circuits having two conductor layers. These flex circuits can be fabricated with or without plated through holes. Because of the plated through hole, terminations for electronic components are provided for on both sides of the circuit, thus allowing components to be placed on either side. In yet another aspect of the technology, a polymer thick film (PTF) circuit is employed. PTF is a printed circuit having conductors printed onto a polymer base film. The PTF is a single conductor layer structure.

In one aspect of the technology, the base material of the flexible polymer film, which provides the foundation for the substrate, ranges from approximately 12 μm to 125 μm (½ mil to 5 mils), however, thinner and thicker material are possible for use in different aspects of the technology. Thinner materials are more flexible and, for most material, the increase in stiffness is proportional to the cube of thickness. Non-limiting examples of different materials used as base films including, but not limited to polyester (PET), polyimide (PI), polyethylene napthalate (PEN), Polyetherimide (PEI), along with various fluropolymers (FEP) and copolymers polyimide films. Adhesives are used as the bonding medium to create the substrate. In an additional aspect, a metal foil is used as the conductive element of the flexible substrate. The metal foil is the material from which the circuit paths are etched. A wide variety of metal foils of varying thickness may be used as is known in the art.

In accordance with one aspect of the technology, the LED chip 30 comprises a sapphire substrate and includes at least an N type semiconductor layer, a semiconductor light emitting layer and a P type semiconductor layer, which are sequentially stacked. In one aspect, the N type semiconductor layer is an N type GaN (gallium nitride) layer, the semiconductor light emitting layer may consist of gallium nitride or indium gallium nitride, and the P type semiconductor layer is a P type GaN layer. Further, the P type semiconductor layer and the N type semiconductor layer are respectively connected to a positive end and a negative end of an external power source by at least one electrical connection line 50. The thermally conductive binding layer 40 is used to bind the LED chip 30 to the flexible polymer substrate. In general, the thermally conductive binding layer 40 consists of silver paste, tin paste, copper-tin alloy or gold-tin alloy. The circuit layer is 50 formed on the flexible substrate 10 and includes a circuit pattern. The electrical connection lines 60 are used to connecting the LED chip 30 to the circuit layer 50. That is, the positive and negative ends of the LED chip 30 are respectively connected to the positive and negative terminals of the circuit layer 50 so as to supply power to the LED chip 30 and turn on the LED chip.

In one aspect, the fluorescent binder or coating 80 is deposited on the LED chip to provide the effect of fluorescence. More specifically, the fluorescent binder 80 can convert the original light generated by the LED chip 30 into the output light within the spectrum of visible light with a specific wavelength. For example, the original light with the spectrum of ultraviolet is converted into substantially blue (425 to 450 nm) or substantially red (650 to 700 nm) light. The package coating 90 is transparent, providing electrical insulation to enclose the circuit layer 50, the electrical connection lines 60 and the fluorescent binder 80. In one aspect, the package coating 90 comprises silicone gel or epoxy resin or other materials known in the art.

In another aspect of the technology, an assembly cap (or housing) 95 is disposed atop a plurality of LED chips 30 configured on a single flexible COB LED. In one aspect, the housing 95 is transparent and remains part of the lighting assembly. However in another aspect, the assembly cap or housing 95 is not transparent and is removed from the lighting assembly after further manufacturing steps are completed. A luminescent coating 96, such as a phosphor coating, is deposited about the interior of the assembly cap 95 and/or placed directly on the COB LED using some other fixture. The single luminescent (e.g., fluorescent) coating disposed about the assembly cap 95 covering a plurality of LED chips 30 results in a uniform light pattern emanating from the entire array. In one aspect, the luminescent coating 96 is applied after the COB LED is configured in its arcuate shape as the coating hardens into a rigid layer. Advantageously, when disposed in an arcuate fashion, the result is a high-powered, compact, light source distributed over an arcuate surface. In contrast to a non-COB LED array, the flexible COB LED (or FCOB LED) array of the present technology provides high-power, uniform lighting options producing an output typically greater than 150 lumens.

Figure 3:
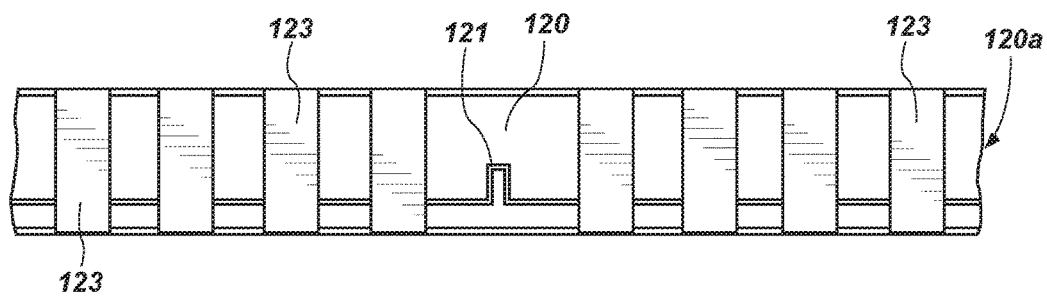
FIG. 3 is a back side view of the flexible substrate of FIG. 2.
Figure 4:
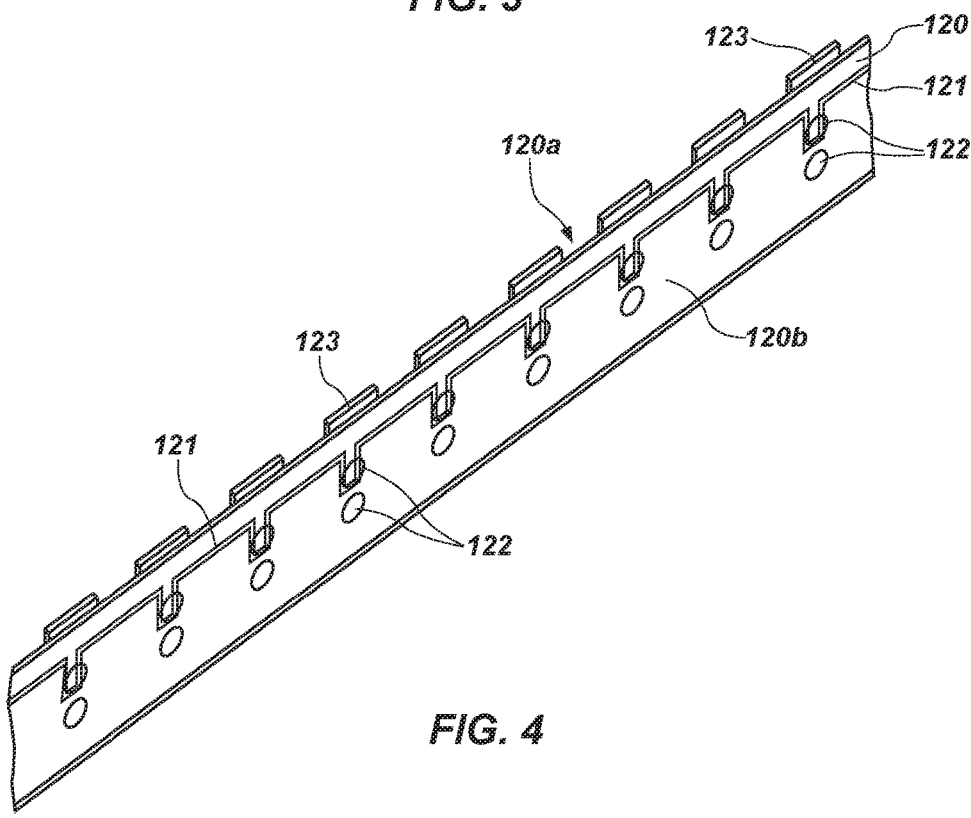
FIG. 4 is a top perspective view of the flexible substrate of FIG. 2.

In one aspect of the technology, stiffening members (e.g., small diameter wires or thin polymer strips, etc.) are placed about the back side of the flexible substrate to increase the stiffness of the flexible substrate but continue to permit the substrate to be malleable. Advantageously, the stiffening members help maintain the flexible substrate in a selected configuration. For example, if the flexible substrate is bent into an arc shape, the stiffening members maintain the flexible substrate in an arcuate shape. This feature minimizes the likelihood that the bond between the flexible substrate and an underlying heat sink will be disturbed. In addition, with specific reference to FIGS. 2-4, a flexible COB substrate 120 is disclosed having wire leads 121 (i.e., circuit patterns) disposed within the substrate 120 coupled to a plurality of bonding pads 122. The bonding pads are configured to receive an LED chip 30 thereon. In one aspect of the technology, the LED chip 30 are secured to the bonding pads by way of an adhesive or other means it is soldered to the positive and negative leads on the bonding pads 122. A stiffening member 123 is secured to a back side 120a of the substrate 120 behind the area where the LED chip 30 is placed on the front side 120b of the substrate 120. When the flexible COB substrate 120 is formed into an arcuate shape after the LED chip 30 is bonded to the substrate 120, it is possible for stresses to be placed on the soldering joints or other connecting joints between the LED chip 30 and the substrate 120. This can result in breakage of the joint and failure of the product. The stiffening member 123 minimizes flexure of the substrate 120 in the area of the stiffening member 123 while allowing flexure of the substrate 120 in the areas between adjacent stiffening members 123. Advantageously, the stresses on the joints between the substrate 120 and LED chip 30 are minimized. In one aspect, the stiffening member 123 comprises a rectangular, thin polymeric material that extends from a first edge 124 of the substrate to a second edge 125 of the substrate. The stiffening member 123 comprises a width that is at least as wide as the LED chip 30 and/or the area where the LED chip 30 will be coupled to the substrate 120. In one aspect, the stiffening member 123 comprises a heat-resistant polymeric film that is adhered to the back side 120a of the substrate 120.

In conventional lighting devices, light output losses associated with both reflectors and lenses persist with a 4 to 12% loss of light each time a light beam passes through a lens or bounces off of a reflector. Expensive coatings on the lenses can reduce these losses to less than 2% per refraction/reflection, but these coatings may be cost prohibitive on lower priced consumer goods. In the example of a lantern, single or multiple high brightness LEDs are projected up into a conical mirrored reflector to project the light into a 360 degree circle around the lantern. Alternatively, these same LEDs are projected upwards with the light illuminating a "diffusing" tube of translucent or textured surface in order to radiate light into a 360 degree circle. This configuration has light losses of 12% and much greater and higher due to inefficiencies of light reflection off of the mirrored surface as well as frequently projecting non-uniform light patterns. Furthermore, a single point light source is considerably more brilliant than a distributed light source of the same lumen output making it more difficult to observe directly without highly uncomfortable glare. This results in the need for diffusers that intercept the light from the single point source and re-radiate from a much larger surface area in order to reduce the "glare." This is similar to the use of lampshades in household lamps. The use of diffuser or lampshade will reduce the total light output significantly with losses often greater than 50% of the total light source output. In an example of a headlamp, one or more LEDs may be employed to provide overlapping circular patterns of light. A single LED will provide high brightness for a spot beam that gives limited area lighting and often will provide two or more smaller output LEDs that project overlapping areas of light for close up task lighting. The overlapping technique of projecting several light "spots" does not create a uniform field of light but rather circles of varying light intensities, which is not optimal. In the example of bike headlights, one or more high brightness LEDs utilizing either a reflector or a total internal reflection (TIR) lens may be used to collimate the light into a tight spot beam for distance with some peripheral light emitted in a concentric cone for peripheral light. Typically this cone extends for 30 to 45 degrees out from the line of sight of the spot beam. While this works well for aiding visibility for the rider, it does not provide effective visibility of the rider by approaching cars or other threats. Various configurations attempt to divert some LED light through side holes, add additional low power LEDs on the side or use polycarbonate light pipers to divert light to the side of the rider. Tail-lights have similar limitations and attempt to divert light to the side by additional LEDs, however this still leaves a number of "dark" angles of approach where the lights are not visible to oncoming threats. Aspects of the current technology improve these deficiencies.

With reference to FIGS. 3a-3c, in accordance with one aspect of the technology, a planar, linear FCOB LED strip 100 is formed into a 360 degree ring and can be bonded to a 360 degree annular aluminum structure for use in a lantern or flashlight, for example. In this aspect, the annular aluminum structure acts as the heat sink of the FCOB LED structure. An imaginary axis normal to a center of at least one of the plurality of LED chips 30 disposed on the strip 100 is disposed at a non-parallel angle with respect to an imaginary axis normal to a center of an adjacent one of the plurality of LED chips 30, though in other arrangements an imaginary axis normal to one of the LED chip 30 is substantially parallel with an imaginary axis normal to an adjacent LED chip 30. Selection of the LED chip 30 used in the FCOB LED array includes the choice of illumination angles with respect to an axis normal to the flexible substrate 10. In one aspect of the technology, the LED chip will project a substantially even concentration of light having a conical projection of 120 degrees (e.g., 60 degrees off a central axis of the LED chip). Because of the different conical shapes of the LED chips 30, the field of illumination of the different chips 30 is necessarily different. However, in one aspect, the field of illumination of at least one of the plurality of LED chips is different than the field of illumination of at an adjacent one of the plurality of LED chips in that the primary field of illumination is directed in a different direction as an adjacent chip. Advantageously, the annular structure of the FCOB LED provides for a consistent 360 illumination with LED chips 30 manufactured on a single substrate.

While specific reference is made to a strip 100 formed into a substantially 360 degree shape, it is understood that numerous shapes can be formed. For example, in one aspect, a single planar flexible substrate is disposed in an arcuate orientation forming an arc ranging from 120 to 180 degrees. A first plurality of LED chips 30 are mounted on a first arcuate substrate comprises a first lighting sub-assembly and a second plurality of LED chips mounted on a second arcuate substrate comprises a second lighting sub-assembly. The first and second sub-assemblies each comprises a substantially 180-degree arc coupled together to form a substantially 360 degree ring. The first and second sub-assemblies are powered by a single power source. However, power may be provided selectively to each of the first and second sub-assemblies turning them on alternatively or together as desired.

Figure 5A:
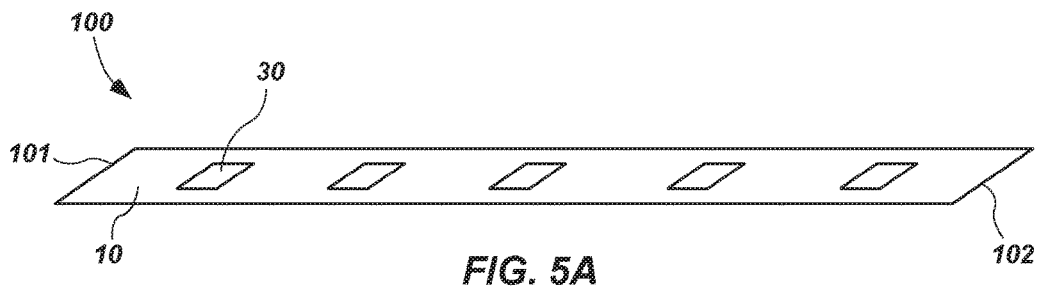
FIG. 5a is a perspective view of a flexible COB LED array in accordance with one aspect of the technology.
Figure 5B:
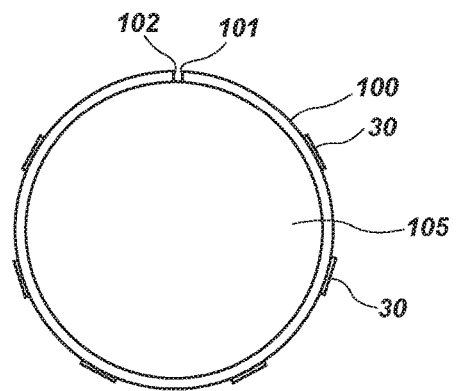
FIG. 5b is a top view of a flexible COB LED array in accordance with one aspect of the technology.
Figure 5C:
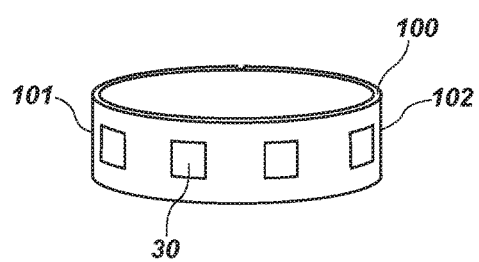
FIG. 5c is a perspective view of FIG. 5b.
Figure 6:
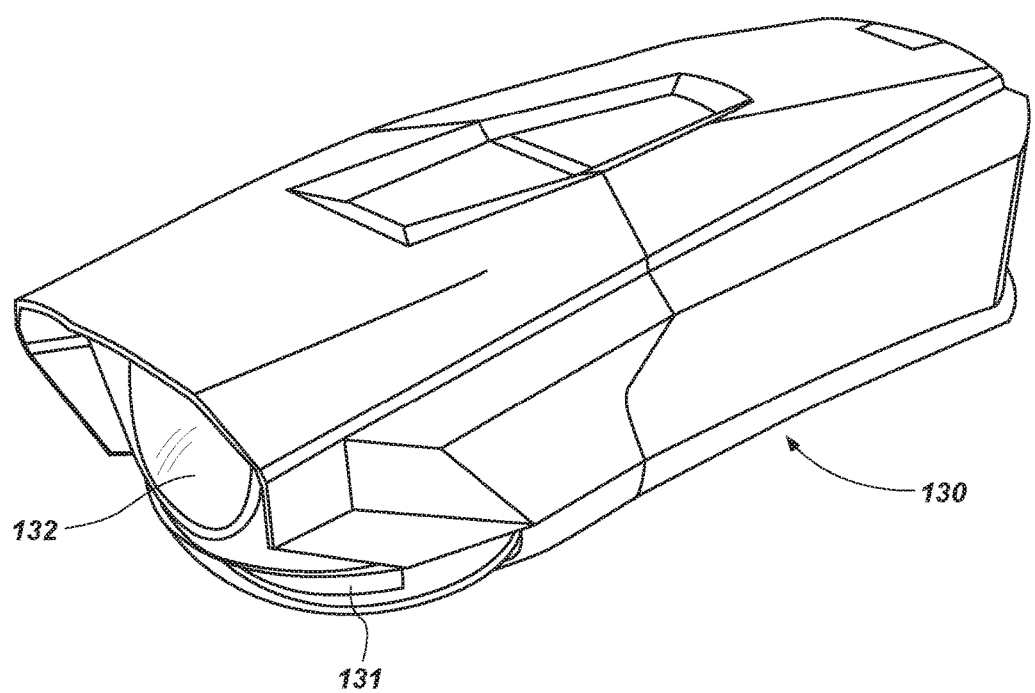
FIG. 6 is a perspective view of a headlight in accordance with one aspect of the technology.

In another aspect, a planar, linear FCOB LED strip (like that shown in FIG. 5a) can be shaped to a 120 degree arc and bonded to a 120 degree heat sink for wide illumination of a front facing task lighting. For example, FIG. 6 discloses a bicycle light 130 having a 120 degree arc FCOB LED light 131 disposed on a front thereof. Advantageously, the light evenly illuminates the user's front and sides. In a bicycle light application, for example, the front and sides of the bicycle are illuminated for high awareness of road hazards, animals, and other points of interest. In addition, the biker has high visibility to all oncoming traffic within a full 180 degree arc (120 degrees of FCOB plus 30 degrees on either side of each LED chip 30) in front with no dark spots/angles where an oncoming driver will not see the direct light of the FCOB LED. If combined with a similar red tail-light (i.e., the luminescent binder combines with the LED light to produce a red light) with a similarly shaped red FCOB LED, the biker will have complete 360 degree visibility to all oncoming traffic. In one aspect of the technology, the FCOB LED is combined with a conventional spot beam LED 132 (or other light sources) which will provide the longer distance lighting of a forward target. In one aspect, the spot beam 132 can be tightly collimated into a brighter spot beam as the peripheral light is provided by the FCOB LED 131. While reference to use with a bicycle is referenced herein, it is understood that the FCOB LED array may be used with any number of products in any number of applications. For example, use as a headlamp, flashlight, lantern, headlight, lamp, and other lighting applications are all contemplated herein. Generally speaking, by applying calculated geometries to the FCOB LED patterns, complex arcuate curves and angles can be obtained after mounting to the appropriate aluminum or other metal structures. In one aspect of the technology, where a FCOB LED is mounted onto a fixture having a 120 degree arc, the resulting light will be radiated outwards for greater than 180 degrees of illumination. In another aspect of the technology, the FCOB LED is fabricated as a planar arc and then mounted onto a fixture having a 120 degree arc with a 30 degree downward cant. The resulting light pattern is a 180 degree horizontal illumination pattern with vertical light beginning upwards at 30 degrees and evenly distributed downward to 90 degrees straight down.

Figure 7A:
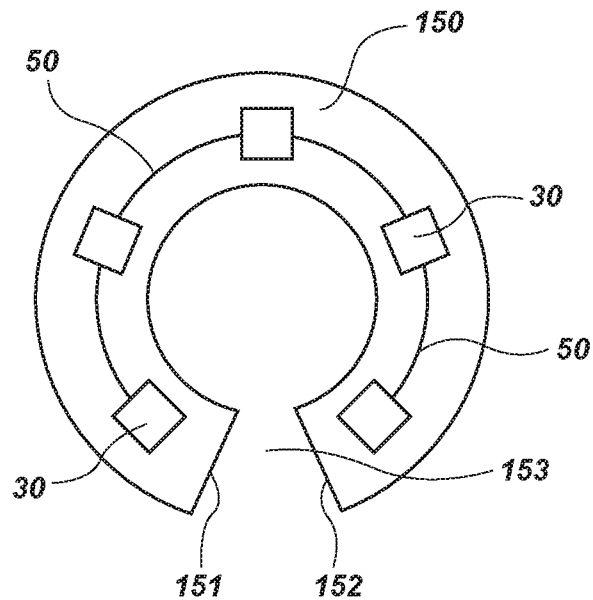
FIG. 7a is a top view of a flexible COB LED array in accordance with on aspect of the technology.
Figure 7B:
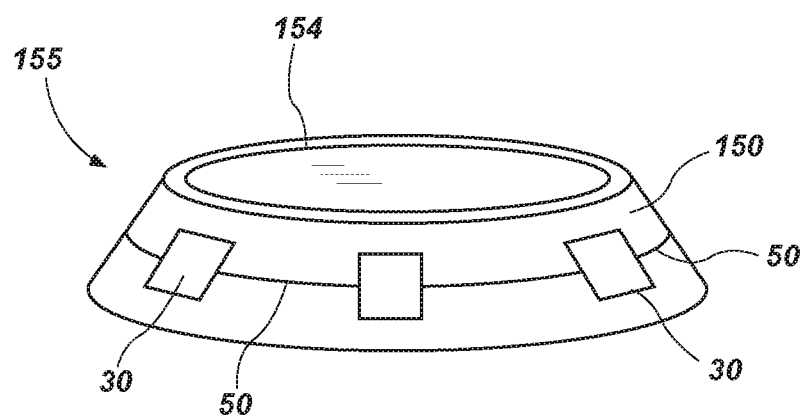
FIG. 7b is a perspective view of a flexible COB LED array mounted on a heat sink in accordance with one aspect of the technology.

In one aspect of the technology, with reference to FIGS. 7a-7b, a planar arc pattern of the FCOB LED can be bonded to a horizontally located conical (angled) semi-circle (or full circle) aluminum structure to yield a semi-circular (or full circle) light ring with a 45 degree downward angled light. In this aspect, planar flexible substrate 150 is shaped to approximate a ring with an opening 153 through one side of the ring, wherein opposing sides 151, 152 of the opening 153 through the ring define a wedge-shaped opening. Thus arranged, the planar flexible substrate 150 is disposed on a truncated cone-shaped heat sink 154 creating a single annular assembly 155, wherein an imaginary axis normal to at least one of the LED chips 30 is not parallel to a plane corresponding with a bottom surface or a plane corresponding with a top surface of the heat sink 154. In one aspect, when used in connection with a hand-held flashlight, the single annular assembly 155 is disposed on the flashlight in such a way that an imaginary axis normal to at least one of the LED chips is not parallel or normal to a longitudinal axis of the flashlight.

Figure 8A:
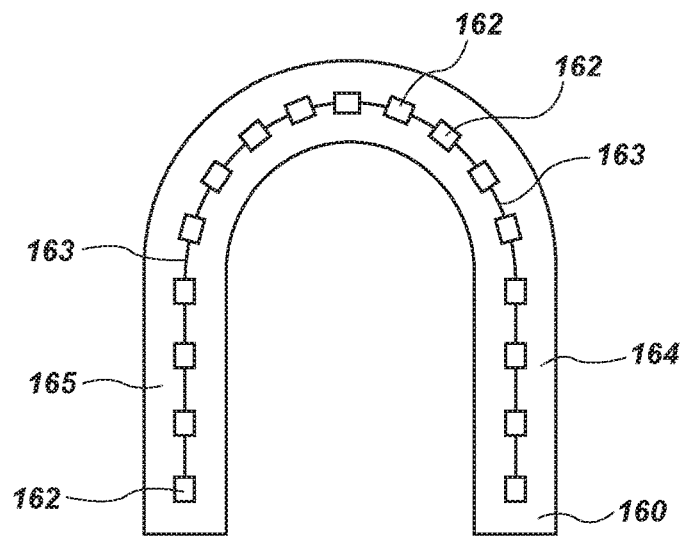
FIG. 8a is a top view of a flexible COB LED array in accordance with on aspect of the technology.
Figure 8C:
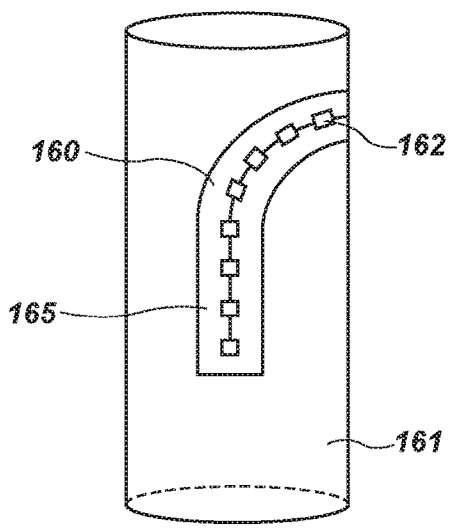
FIG. 8c is a perspective view of a flexible COB LED array mounted on a heat sink in accordance with one aspect of the technology.
Figure 8B:
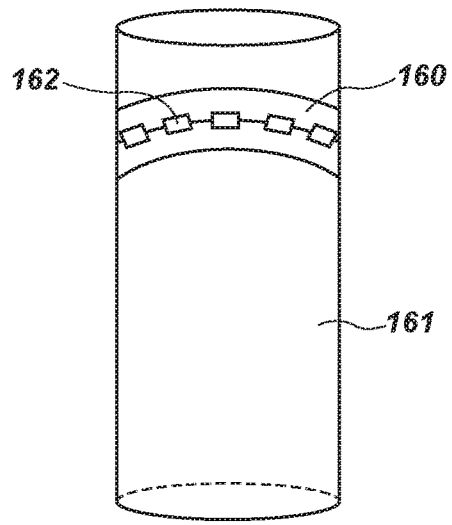
FIG. 8b is a perspective view of a flexible COB LED array mounted on a heat sink in accordance with one aspect of the technology.
Figure 9:
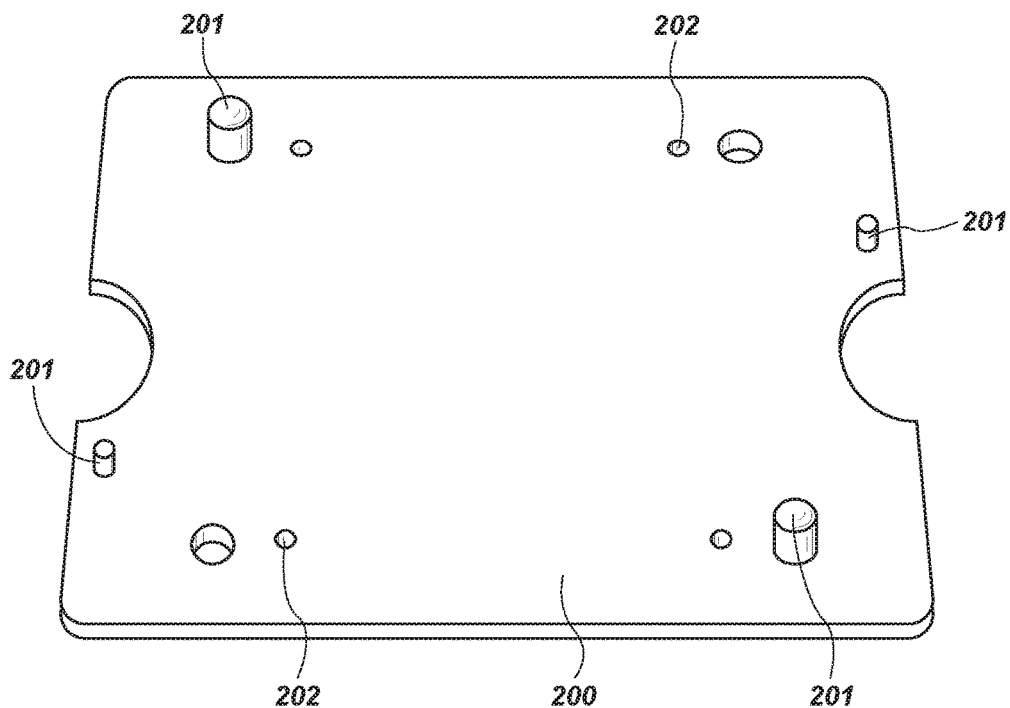
FIG. 9 is a top view of a base plate in accordance with one aspect of the technology.
Figure 10:
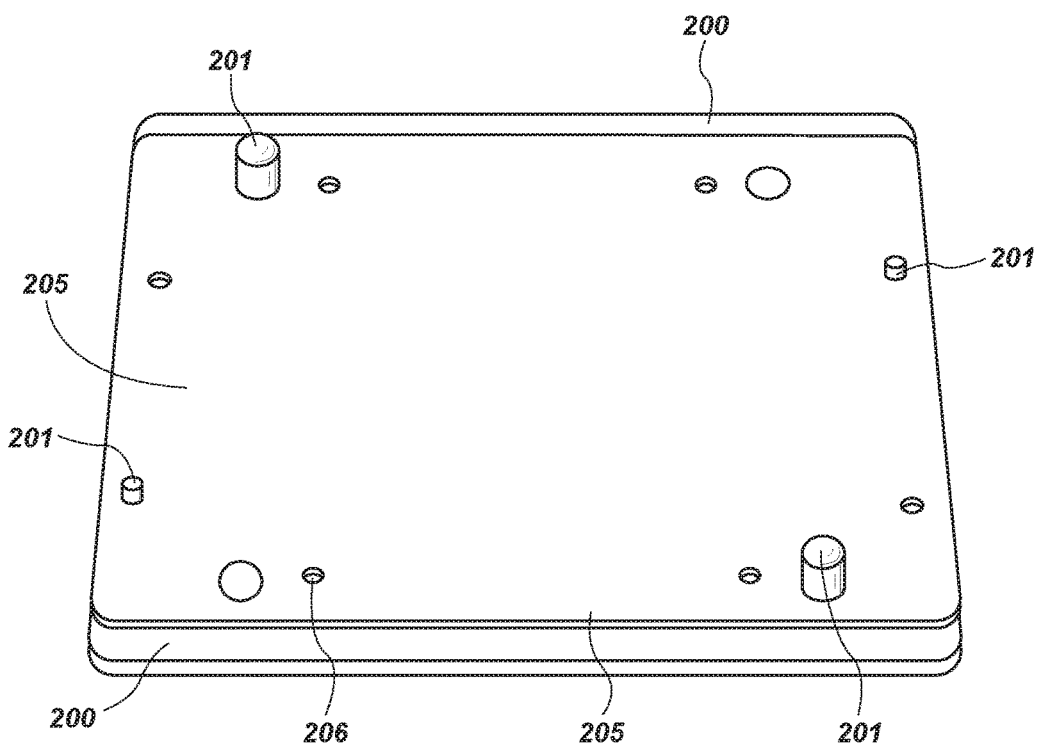
FIG. 10 is a top view of an intermediate plate disposed on a base plate in one aspect of the technology.

With reference now to FIGS. 8a through 8c, a U-shaped FCOB LED 160 is created and disposed about a cylindrical heat sink 161. Similar to the FCOB LEDs referenced herein, a plurality of LEDs 162 are electrically coupled together by wiring 163 on a flexible planar substrate. The FCOB LED 160 is conformable and bends about the radius of the cylindrical heat sink 161 to form a light device capable of projecting light in both forward and lateral directions. While a cylindrical heat sink 160 is specifically referenced, the U-shaped FCOB LED 160 may be disposed about any number of arcuate surfaces to create a number of different shaped lighting devices. Side portions 164, 165 of the U-shaped substrate are disposed on opposing sides of the sink 161. However, depending on the relative size of the sink 161 and/or the specific geometry of the U-shaped substrate, the planar substrate is disposed about a cylindrical heat sink in a manner wherein an imaginary axis disposed normal to an LED chip on a first side 164 of the U-shaped substrate is not parallel with an imaginary axis disposed normal to an LED chip on a second size 165 of the U-shaped substrate.

In accordance with one aspect of the technology, the FCOB LED is manufacturing through a series of steps. It is noted that no specific order is required in these methods unless required by the claims set forth herein, though generally in some embodiments, the method steps can be carried out sequentially. Broadly speaking, in accordance with one aspect of the technology, a base plate is provided upon which an intermediate plate is disposed. The base plate is provided with guide posts that correspond to alignment holes placed within the intermediate plate. A flexible substrate is disposed atop the intermediate plate. The flexible substrate likewise has alignment holes therein for placement about guide posts within the base plate. A magnetic top plate is disposed atop the flexible substrate. The magnetic top plate is also provided with alignment holes corresponding to the guide posts disposed within the base plate. The base plate, intermediate plate, and top plate are referred to herein as the "plate assembly."

A die (or LED chip) 30 is secured (via an adhesive or other means known in the art) to the flexible substrate and cured. Once cured, the die is soldered to electrically conductive contact points afterwhich a resin is place atop portions of the assembly. The assembly is then cured again. Once cured, the flexible substrate assembly is removed from the plate assembly. An arcuate heat sink is prepared with a conductive adhesive about a surface of the heat sink. Afterwards, the flexible substrate assembly is disposed about the arcuate heat sink. In one aspect, an arcuate cap or housing having an internal cavity shaped to approximate the arcuate heat sink is prepared with a fluorescent binder wherein the flexible substrate/heat sink assembly is placed.

Figure 11:
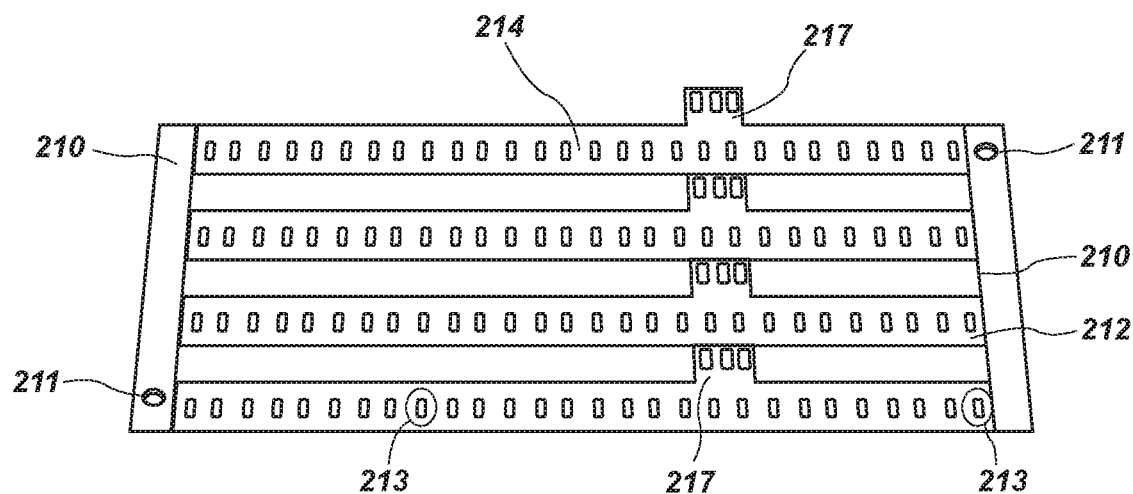
FIG. 11 is a top view of a flexible substrate in one aspect of the technology.
Figure 12:
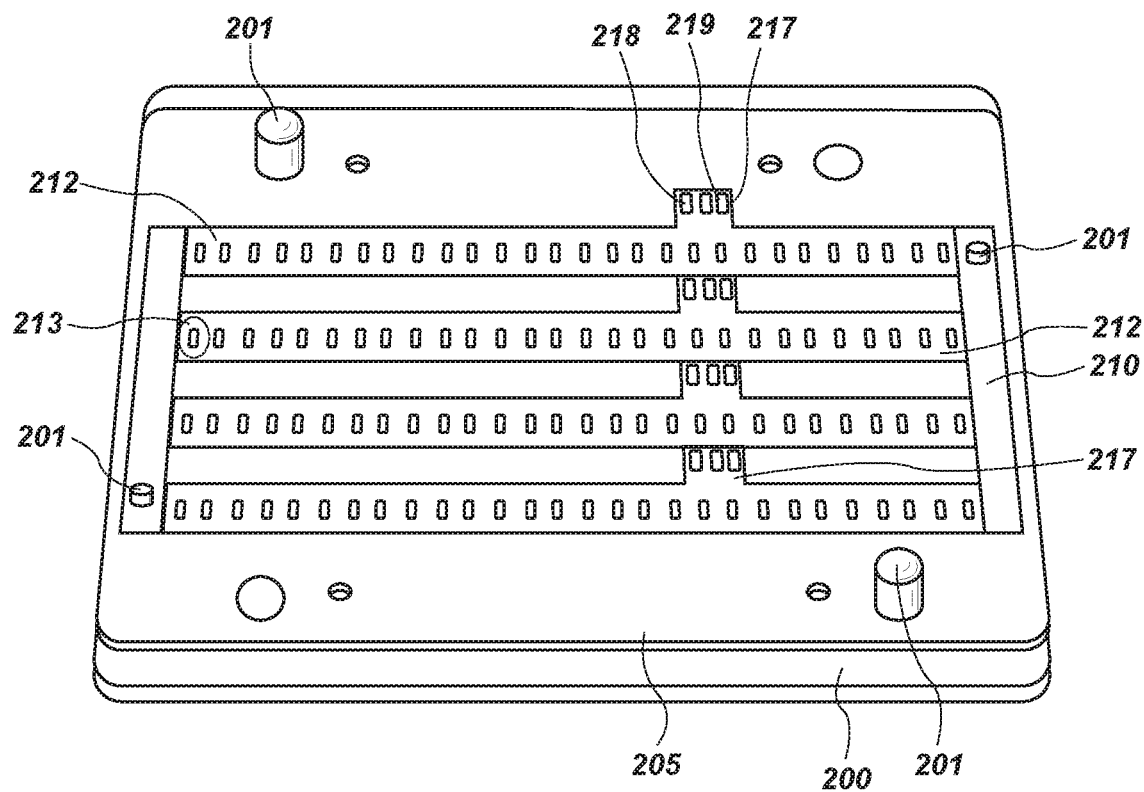
FIG. 12 is a top view of a flexible substrate disposed on the intermediate plate in one aspect of the technology.
Figure 13:
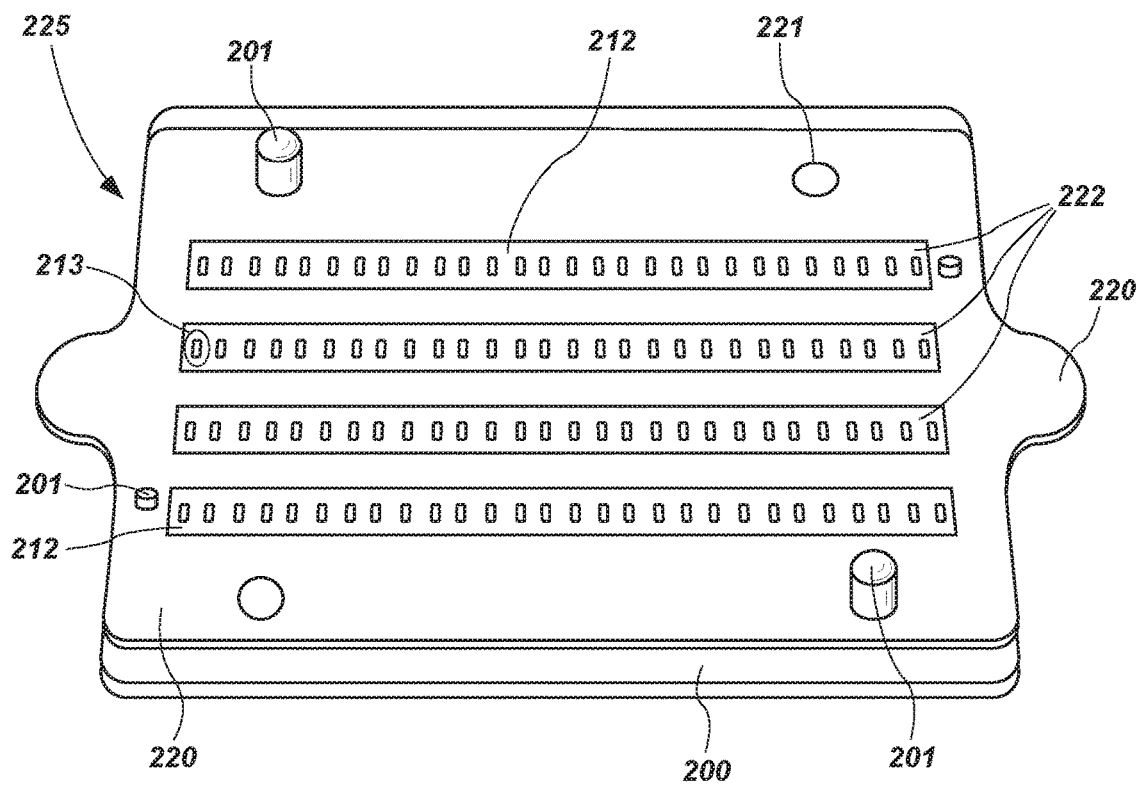
FIG. 13 is a top view of a magnetic top plate disposed on top of the flexible substrate in one aspect of the technology.

With reference now to FIGS. 9 through 23, in accordance with one aspect of the technology, a substantially planar metallic base plate 200 is provided. The base plate comprises a plurality of guide posts 201 and alignment holes 202. A substantially planar intermediate plate 205 is disposed atop the base plate 200. In accordance with one aspect of the technology, the intermediate plate 205 comprises a plurality of alignment holes that correspond to the guide posts 201 of the base plate. In this manner, the two plates are properly positioned with respect to one another. As shown in FIGS. 11 and 12, a flexible substrate subassembly 210 is disposed atop the intermediate plate 205. The subassembly 210 comprises a plurality of alignment holes 211 to be placed over respective guide posts 201 of the base plate. The flexible substrate subassembly 210 comprises a plurality of longitudinal flexible printed circuit boards (i.e., the flexible substrate) 212, each having a plurality of contact points 213 distributed evenly across a top surface 214 of the printed circuit board 212. The contact points comprise a plurality of substantially oval contact points 215 each disposed above a plurality of circular contact points 216. The contact points 213 are arrayed about the printed circuit board 212 to permit placement of a die or LED chip 30. In accordance with one aspect of the technology, the flexible printed circuit boards 212 comprise a tab 217 disposed about one side of the circuit board 212. Tab 217 comprises contact points 218 and 219 for powering the circuit board 212 once fully assembled.

In accordance with one aspect of the technology, a substantially planar magnetic top plate 220 is disposed atop the flexible substrate subassembly 210. The top plate 220 also comprises alignment holes 221 configured to mate with post 201 to ensure proper alignment of the entire assembly. In addition to the alignment holes, the top plate 220 comprises a plurality of apertures 222 corresponding substantially to the dimensions of the flexible printed circuit boards 212. In this manner, a working area is defined wherein LED chips 30 can be placed, soldering, placement of resin, and other curing procedures are conducted within the working area. The top plate 220 secures the flexible printed circuit boards 210 within the plate assembly 225 to permit machine placement of materials upon the flexible printed circuit boards 212 in the working area.

Figure 14:
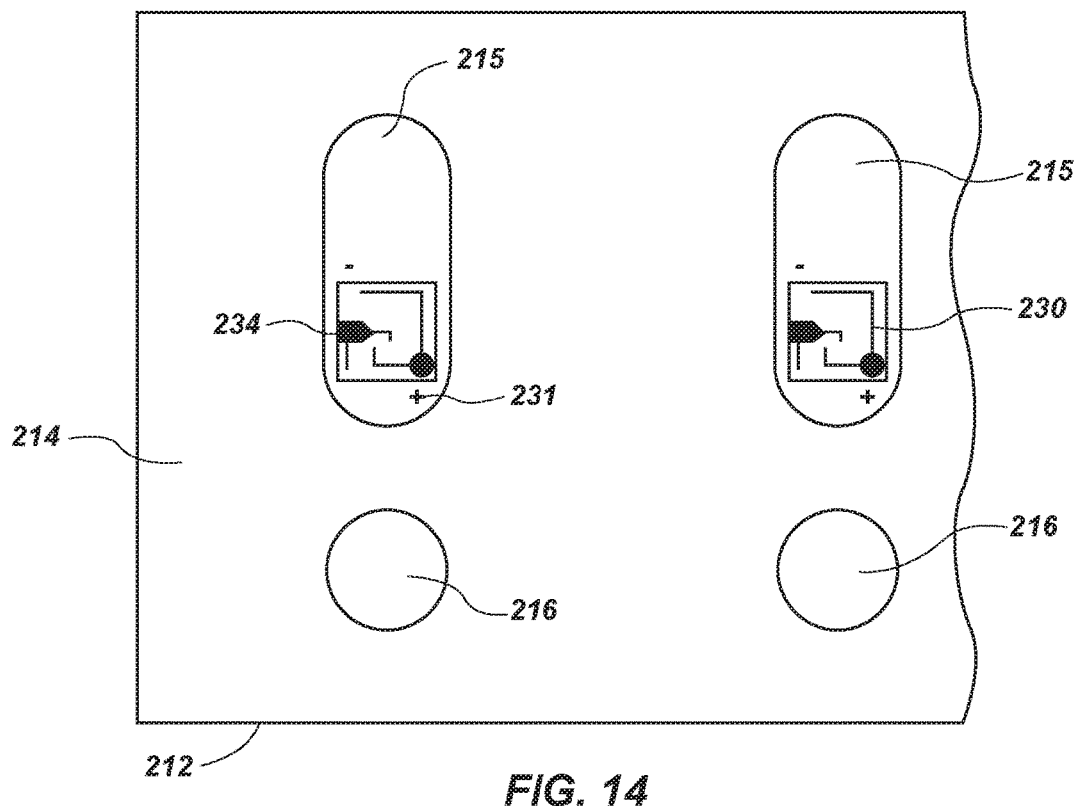
FIG. 14 is a close up view of an LED die disposed on a contact point of the flexible substrate in accordance with one aspect of the technology.
Figure 15:
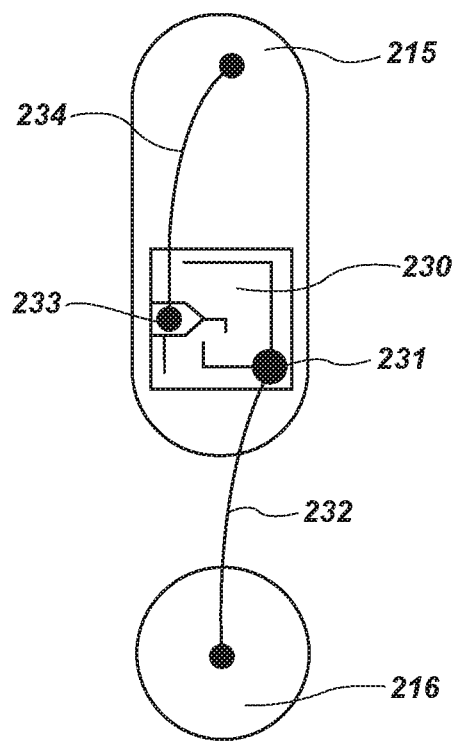
FIG. 15 is a close-up view of wire connections from the LED to contact points on the flexible substrate in one aspect of the technology.
Figure 16:
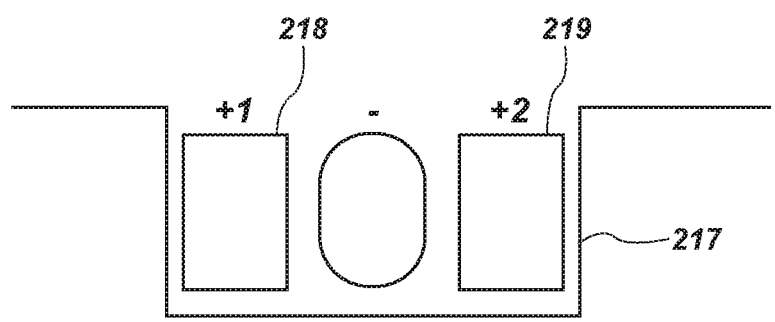
FIG. 16 is a close up view of a power tab of the flexible substrate in one aspect of the technology.
Figure 17:
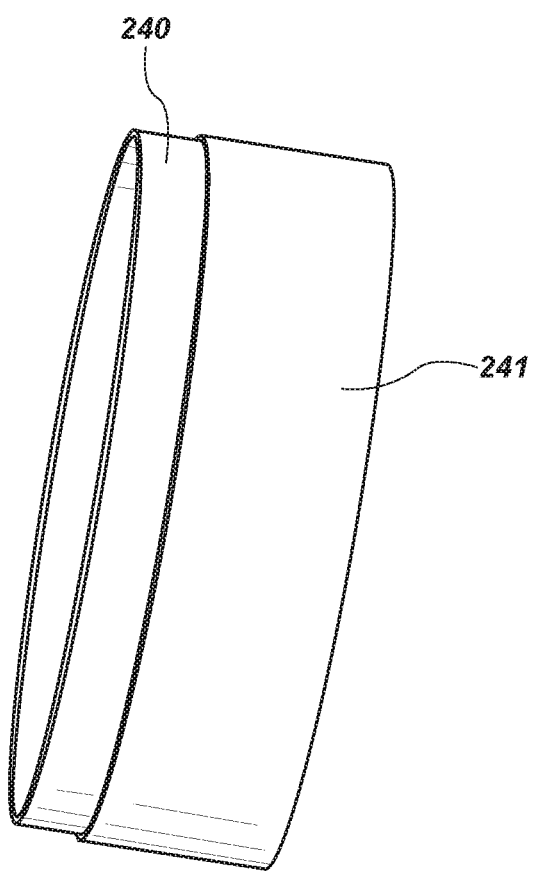
FIG. 17 is a perspective view of an annular heat sink in accordance with one aspect of the technology.
Figure 18:
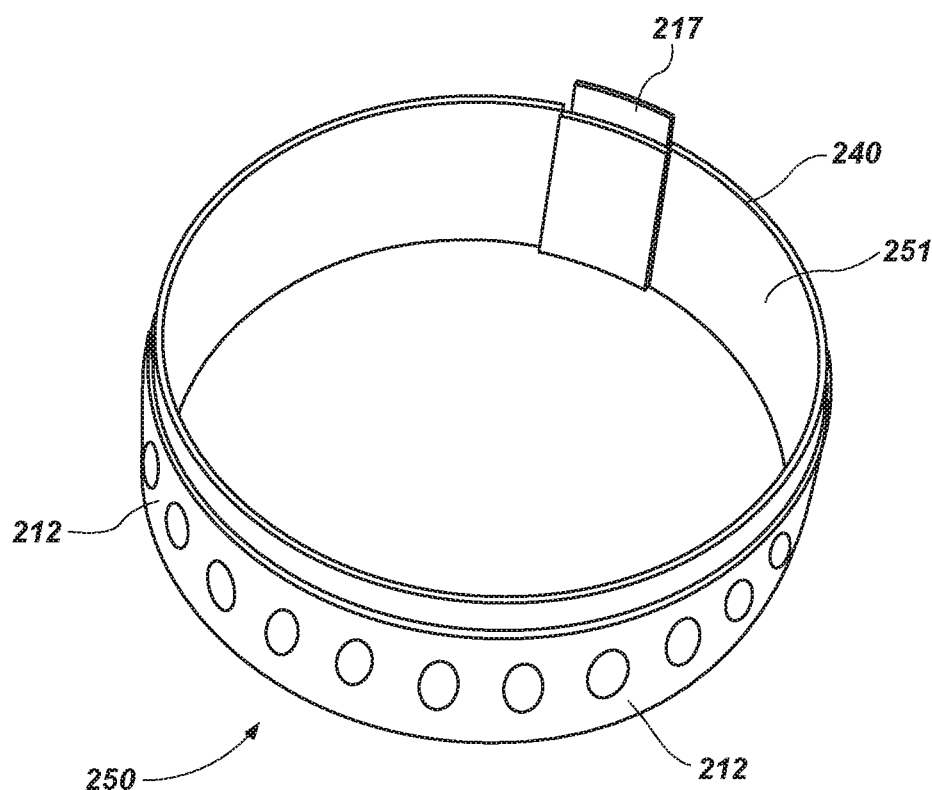
FIG. 18 is a perspective view of a flexible COB LED array mounted on an annular heat sink in accordance with one aspect of the technology.
Figure 19:
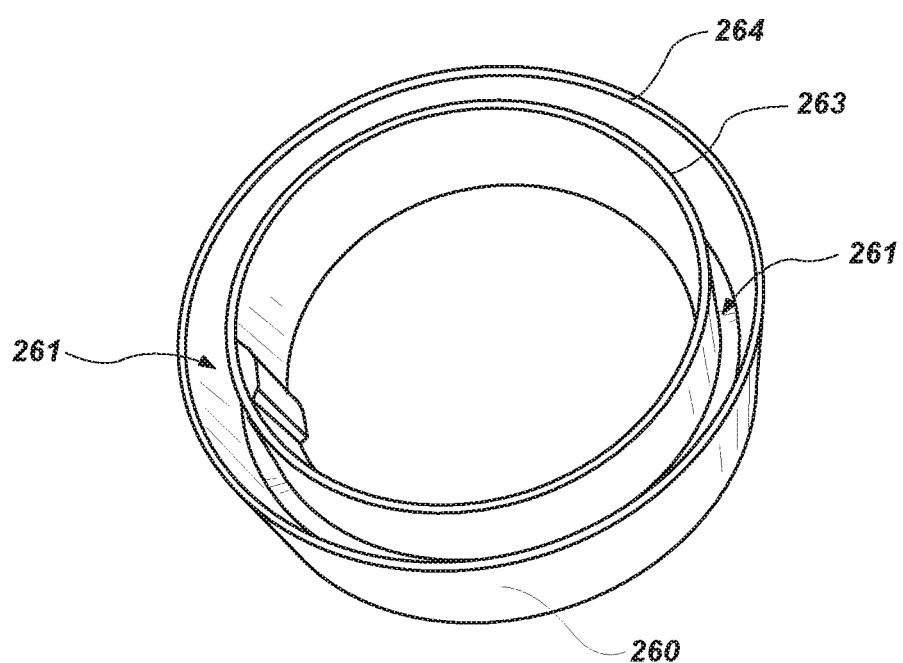
FIG. 19 is a perspective view of a housing in one aspect of the technology.
Figure 20:
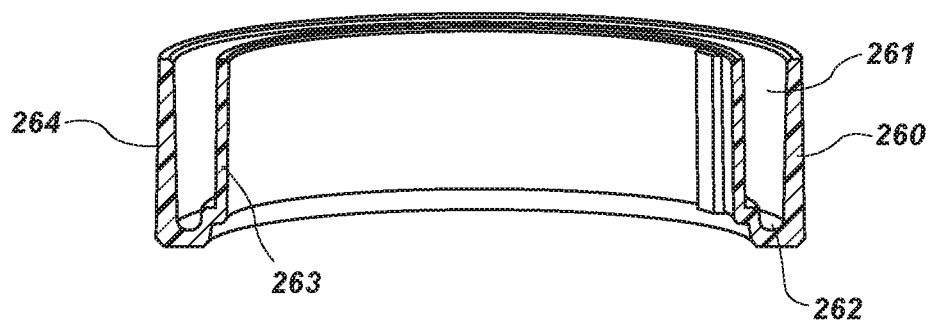
FIG. 20 is a cut-away side view of a housing in one aspect of the technology.
Figure 21:
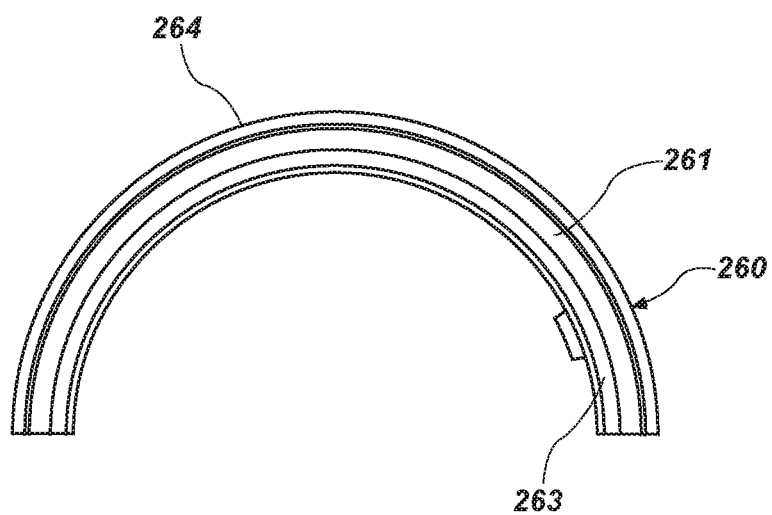
FIG. 21 is a top view of a housing in one aspect of the technology.
Figure 22:
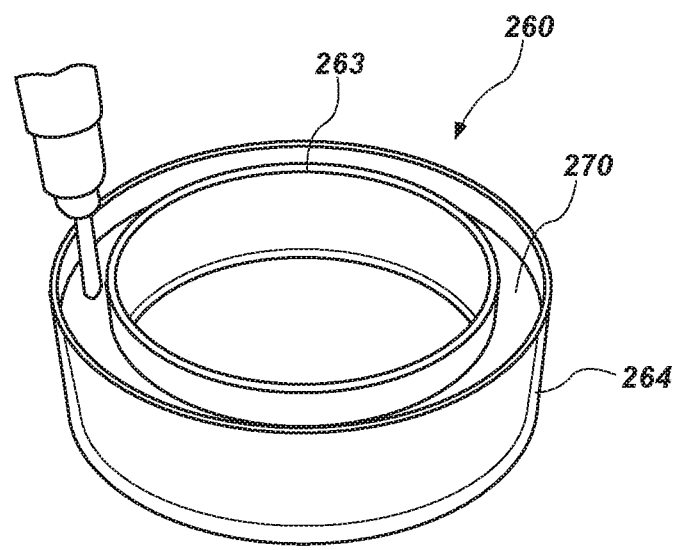
FIG. 22 is a perspective view of a housing with fluorescent binder being disposed within the housing.
Figure 23:
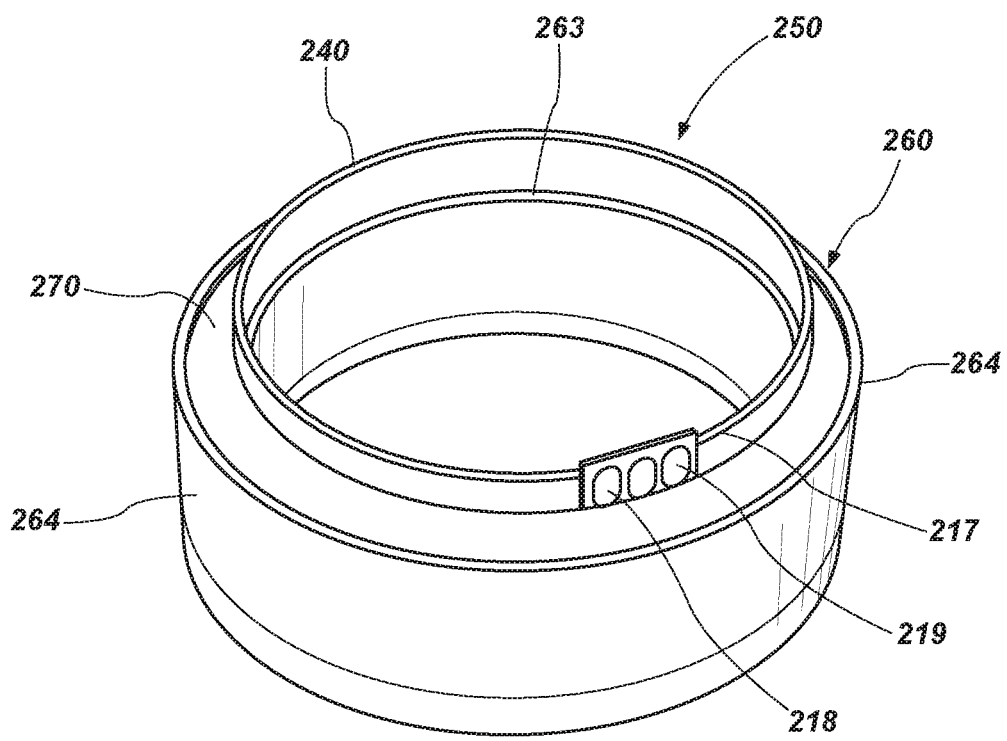
FIG. 23 is a perspective view of the housing and fluorescent binder with the flexible COB LED array and heat sink subassembly disposed within the housing.

With specific reference now to FIGS. 14-16, a die (or LED chip) 230 is secured to the oval contact point 215 with a heat transmissive adhesive and the subassembly is cured at 150 degrees Celsius for approximately 1.5 hours. A first connecting wire 231 is soldered to positive lead 231 on the die 230 and the circular contact point 216. A second connecting wire 233 is soldered to negative lead 234 on the die 230 and the oval contact point 215. Resin is disposed atop the soldered subassembly after which the subassembly is cured at 150 degrees for about 1.5 hours. In accordance with one aspect, the die and wire soldering are completed using optically positioned instrumentation as is known in the art. Tab 217 comprises leads 218 and 219 that are electrically coupled to the LED chips 30 on the substrate 210 and are used to couple the assembly to a power source associated with an end product.

In accordance with one aspect of the technology, with reference now to FIGS. 17-23, an arcuate heat sink 240 is provided. In one aspect, the arcuate heat sink 240 comprises a metal ring, though numerous other shapes and arrangements are contemplated for use herein. The metal ring 240 comprises a heat-transmissive adhesive 241 disposed about at least a portion of the ring. A flexible substrate subassembly 210, having the LED chips 30 soldered to contact pads and resin cured, is placed about the exterior of the metal ring 240. In a preferred aspect, opposing ends of the flexible substrate 210 are adjacent one another when disposed about the metal ring 240. The arcuate LED subassembly 250 can be disposable within a transparent housing 260. The housing comprises a clear plastic, glass, polymer, or other suitable transparent material and is shaped to approximate the arcuate LED subassembly 250. In this aspect, the housing 260 is shaped to approximate a ring. The housing 260 comprises a cavity 261 configured to receive the metal ring therein defined by annular inner wall 263 and annular outer wall 264. An annular groove 262 is disposed about a bottom of the cavity 261 for receiving an end of the LED subassembly 250 therein. In accordance with one aspect of the technology, a quantity of a luminescent binder (including, but not limited to fluorescent binders) 270 is placed within the cavity 261 of the housing 260. A common yellow phosphor material is cerium-doped yttrium aluminum garnet (Ce3+: YAG) though other materials may be used. The LED subassembly 250 is placed in the housing 260, either before or after placement of the fluorescent binder 270. In one aspect, the internal surface of the LED subassembly 250 is adjacent to the internal wall 262 of the inner ring of housing 260. The LED subassembly 250 and housing 260 are sized such that when the LED subassembly 250 is placed within the housing 260, there is a space between the outer surface of the LED subassembly 250 and the internal wall of the housing 260. In this manner, the luminescent binder 270 is distributed about the entire inside surface of the outer wall 264 to assist in the distribution of light about the entire outer surface of the housing. In one aspect of the technology, a vacuum is applied to the subassembly 250 and housing 260 assembly in order to remove air pockets from the luminescent binder 270.

While an annular shaped housing 260 has been described herein, it is understood that numerous shaped housing are contemplated for use herein in order to accommodate any number of shapes of FCOB LEDs (including those shown in FIGS. 7 and 8, for example) and/or the housing 260 may be removed after the luminescent binder 270 has set. Additionally, while a single-piece housing has been shown, it is understood that a multi-piece housing may be used in order to accommodate different geometries and/or different applications. For example, in one non-limiting example, an L-shaped FCOB LED is disposed about a heat sink that requires the heat sink to be placed in a bottom portion of the housing with a top portion coupled thereto after the FCOB LED is placed in the bottom portion. In this aspect, one or more apertures are located within the housing to allow for injection of the fluorescent binder. In an additional aspect, the housing may only partially encapsulate the FCOB LED. In one non-limiting example, the FCOB LED may be placed on an arcuate heat sink in such a manner that only the portion of the heat sink on which the FCOB LED is applied is intended to be encapsulated. That is, the surface area of the heat sink is larger than the FCOB LED. A housing intended to cover only the arcuate LED subassembly (i.e., the light producing flexible element) is mounted to the heat sink. A fluorescent binder is pre-applied to the housing and conforms to the surface of the arcuate LED subassembly during the mounting process.

Of course, it is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements. Thus, while the present invention has been described above with particularity and detail in connection with what is presently deemed to be the most practical and preferred embodiments of the invention, it will be apparent to those of ordinary skill in the art that numerous modifications, including, but not limited to, variations in size, materials, shape, form, function and manner of operation, assembly and use may be made without departing from the principles and concepts set forth herein.

The invention claimed is:

1. A lighting device mounted in a hand-held flashlight, comprising:
   a first light source comprising:
      plurality of LED chips mounted on a planar flexible substrate, wherein the planar flexible substrate is disposed in an arcuate orientation forming a ring with a hollow center, wherein each of the plurality of LED chips comprises an imaginary axis normal to the planar flexible substrate wherein the imaginary axis of each of the LED chips is parallel to one another;
      a heat sink having an arcuate surface shaped to approximate the arcuate orientation of the planar flexible substrate, the heat sink being disposed in contact with a back of the planar flexible substrate; and
      a luminescent coating disposed about a top surface of the arcuate planar flexible substrate
   a second light source comprising:
      at least one spot beam LED disposed adjacent the first light source, said at least one spot beam LED having an imaginary axis normal to the planar flexible substrate of the plurality of LED chips.

2. The lighting device of claim 1, wherein the field of illumination of at least one of the plurality of LED chips is different than the field of illumination of an adjacent one of the plurality of LED chips.

3. The lighting device of claim 1, wherein the field of illumination of at least one of the plurality of LED chips is different than the field of illumination of the spot beam LED.

4. The lighting device of claim 1, further comprising a plurality of stiffening members disposed behind each of the LED chips.

5. The lighting device of claim 4, wherein the stiffening members comprise a rectangular flexible material disposed about the back side of the flexible substrate.

6. The lighting device of claim 4, wherein the stiffening members extend from a first end of the flexible substrate to a second edge of the flexible substrate.

7. The lighting device of claim 4, wherein each of the stiffening members comprises a width that is at least as great as the width of the LED chip.

8. The lighting device of claim 4, wherein the stiffening members comprise a heat resistant polymer film.

9. The lighting device of claim 1, further comprising a tab extending form a lateral side of the flexible substrate, said tab comprising an electrical coupling for coupling to a power source.

10. The lighting device of claim 9, wherein the tab is not covered by the luminescent coating.

11. A lighting device, comprising:
   a plurality of LED chips mounted on a continuous planar flexible substrate, wherein the continuous planar flexible substrate is disposed in an arcuate orientation forming a 360 ring having a hollow center;
   wherein the plurality of LEDs comprises an optical axis that is normal to the continuous planar flexible substrate and wherein the optical axes of the plurality of LEDs are parallel;
   a heat sink having an arcuate surface shaped to approximate the arcuate orientation of the continuous planar flexible substrate and coupled to the flexible substrate between a face of the continuous heat sink and a back of the continuous planar flexible substrate;
   a power source coupled to the plurality of LED chips;
   an LED collimated into a spot beam, said collimated LED disposed adjacent the plurality of LED chips, said collimated LED having an optical axis that is parallel to the optical axes of the plurality of LEDs.

12. The lighting device of claim 11, wherein plurality of LED chips comprises a first sub-assembly and a second sub-assembly, each comprising a 180-degree arc coupled together to form a 360 degree ring.

13. The lighting device of claim 12, wherein the first and second sub-assemblies are powered by a single power source.

14. The lighting device of claim 13, wherein power may be provided selectively to each of the first and second sub-assemblies.

15. A lighting device mounted in a hand-held flashlight, comprising:
   a first light source comprising:
      plurality of LED chips mounted on a planar flexible substrate, wherein the planar flexible substrate is disposed in an arcuate orientation forming a ring with a hollow center, wherein each of the plurality of LED chips comprises an imaginary axis normal to the planar flexible substrate wherein the imaginary axis of each of the LED chips is parallel to one another;

a heat sink disposed in contact with a back of the planar flexible substrate; and a power source coupled to the plurality of LED chips;

a second light source comprising:

a spot beam LED disposed adjacent the first light source, the spot beam LED having an imaginary axis normal to the planar flexible substrate of the plurality of LED chips.

16. The lighting device of claim 15, further comprising an arcuate housing.

17. The lighting device of claim 16, wherein the first and second light sources are disposed within the arcuate housing.

18. The lighting device of claim 16, wherein the heat sink is adhered to the flexible substrate with a conductive adhesive.

19. The lighting device of claim 16, further comprising an arcuate transparent housing, wherein the plurality of LEDs and heat sink are disposed within the arcuate transparent housing.

20. The lighting device of claim 15, wherein a longitudinal axis of the lighting device is parallel with the imaginary axis of the spot beam LED.

* * * * *